United States Patent [19]

Mimata et al.

[11] 3,918,144

[45] Nov. 11, 1975

[54] BONDING EQUIPMENT AND METHOD OF BONDING

[75] Inventors: Tsutomu Mimata, Tokyo; Ryozo Yuzawa, Kodaira, both of Japan

[73] Assignee: Hitachi, Ltd., Japan

[22] Filed: Mar. 25, 1974

[21] Appl. No.: 454,663

[30] Foreign Application Priority Data

Apr. 6, 1973 Japan ............................... 48-38729

[52] U.S. Cl. ................ 228/205; 228/234; 228/249; 228/263; 29/589; 29/628; 228/4.5; 228/6; 228/44.1; 228/49

[51] Int. Cl.[2] ...................... B23K 5/22; B23K 31/02

[58] Field of Search ...... 29/493, 501-503, 589, 628; 228/4, 6, 44, 49

[56] References Cited

UNITED STATES PATENTS

| | | | |
|---|---|---|---|
| 3,474,521 | 10/1969 | Schwenn | 29/493 |
| 3,494,022 | 2/1970 | Maute | 29/589 |
| 3,568,307 | 3/1971 | Zanger et al. | 228/49 |
| 3,628,717 | 12/1971 | Lynch et al. | 228/6 |
| 3,695,502 | 10/1972 | Gaiser | 29/589 |

*Primary Examiner*—Carl E. Hall
*Attorney, Agent, or Firm*—Craig & Antonelli

[57] ABSTRACT

Equipment for bonding a semiconductor pellet to a semiconductor substrate, wherein the pellet is scrubbed onto a gold foil, previously formed on the substrate and heated by a first collet at a first station, so as to provisionally bond the pellet. The resultant substrate is subsequently moved to a second station, and the pellet is again scrubbed by the second collet, the pyramidal planes of which are brought into contact with the pellet and have a sharper inclination than the first collet, so as to bond the pellet with its fixed position corrected, whereby the bonding speed can be increased without lowering the positional precision of the bonding.

11 Claims, 4 Drawing Figures

BONDING EQUIPMENT AND METHOD OF BONDING

The present invention relates to bonding equipment and, more particularly, to equipment for bonding a semiconductor pellet.

BACKGROUND OF THE INVENTION

Among equipment for bonding a semiconductor pellet, there has been proposed one type which carriers out the bonding in such a way that the pellet is absorbed and held by the pyramidal oblique planes of a hollow (an adsorbing portion) formed of a quadrangular pyramid and provide at the lower end of adsorbing means (a collet), and the lower surface of the pellet is brougnt into contact with a tab, a lead frame or the like, and a solder material is melted between the pellet and the supporter such as the tab and lead frame.

With such bonding equipment, unless the pellet is adsorbed with the collet having completely stopped its movement, the adsorbed position and condition of the pellet becomes defective, since the pellet is inclined within the hollow, which is a cause for degrading the precision of the subsequent pellet bonding. Accordingly, additional periods of time, such as a period of time for stabilizing the collet are required and high speed pellet bonding cannot be expected.

Therefore, equipment has been devised which employs a collet having flat adsorbing planes, so as to prevent the pellet from being adsorbed at an angle relative to the pellet bonding. This equipment can adsorb and hold the pellet without inclining it, even for positional precision of the pellet on a jig and even when the collet has not stopped completely, and can offset high speed bonding of the pellet. With this equipment, however, due to inferior precision of the adsorbed position of the pellet and due to the sliding between the collet and the pellet during scrubbing, the bonding precision of the pellet is decreased, and the shift of the pellet relative to a predetermined part of the supporter is comparatively large and amounts to, for example, approximately $\pm 40$ to $\pm 60\mu$.

For this reason, in a semi-automatic bonding apparatus which is used for a wire bonding operation, to provide high speed bonding, there is the necessity for previously conducting, for every component, an alignment of the relative positions of a bonding electrode of the pellet and a capillary of the bonder. Such an alignment operation for every component is adverse to the labor saving aspects of the process. On the other hand, if, for example, the shift of the pellet can be confined to within $\pm 30\mu$ where the size of the bonding electrode is $50\mu \times 50\mu$, then a reliable wire bonding is possible without the foregoing alignment operation, for every component, and even by simplifying or omitting a manual aligning operation.

For such a reason, equipment has been devised which provides a high speed flow of a bonding line and enhances the bonding precision by dividedly performing a pellet bonding step and a bonding position-correcting step.

According to this equipment, as is illustrated in FIGS. 1*a* and 1*b*, at a first station 2 of a heater block 1 which is in a heated condition, a pellet 4 is scrubbed to a substrate 5, e.g. lead frame, by means of a collet 3, and gold foil 6 previously formed on the substrate 5 is melted to thereby form a eutectic (alloy) of gold and silicon.

A pin (not shown) is inserted into one of the guide holes 7 in the substrate 5, and effects a rectangular motion, so that the bonded pellet 4 is intermittently transferred rightwards as viewed in FIG. 1*a*. When the pellet 4 stops at the second station 8 next to the first station 2, a pair of position correcting catchers 9 and 10, which are arranged on the extension of a diagonal line of the pellet 4 and which are in a symmetrical relation with respect to the pellet 4, advance towards the pellet 4, and they correct the position of the pellet 4 to a predetermined position on the substrate 5 by means of 90 notch clicks 11 and 12 provided at their respective forward ends. Since the second station 8 for carrying out the correcting operation is also situated on the heater block 1 heated to a temperature of approxinately 400°C, the eutectic alloy between the pellet 4 and the substrate 5 is in a molten condition (softened condition), and position correction of the pellet can be effected very easily.

With this equipment, although the position can be corrected to comparatively accurate positions (the positional precision is $\pm 30\mu$ or so) at the beginning of use, it becomes impossible to continuously attain high positional precision since gold, silicon, silicon oxide, etc. gradually adhere to the surfaces of the notch clicks 11 and 12 and that the position correcting catches 9 and 10 are warped by heat as illustrated by chain lines in FIG. 1*b*, and it has been revealed that, for example, the precisions of the fixed position of the pellet in the X— and Y—direction relative to the substrate become $\pm 40$ to $\pm 60\mu$.

Since this equipment operates so as to hold the end faces of the pellet 4 between both sides thereof, the problem of easy failure of the pellet also occurs.

On the other hand, it has been experimentally determined that when the foregoing collet having a pyramidal hollow has a scrubbing time of approximately 4 seconds, good pellet bonding precision can be achieved. This is believed to be due to the fact that the pellet which is held in the adsorbing portion, shifts into a stable state within the pyramid by a swing attributed to the scrub, and that most of the pellets fall into the stable state in 4 seconds or so.

It has also been found that the pellet is stabilized in a shorter time at the scrub by making the vertical angle of the pyramid sharper and the oblique planes steeper. Such a measure, however, has been found to be practically unsuitable for pellet adsorption because, for adsorbing the pellet on the jig by a collet having sharply inclined planes, the range in which the pellet is reliably picked up is narrow, while positional precision of the pellet on the jig can not be expected to be high.

OBJECTS OF THE INVENTION

It is, accordingly, an object of the present invention to provide bonding equipment which can perform an automatic bonding operation at high speed.

Another object of the present invention is to provide bonding equipment which can increase the positional precision of pellet bonding.

Another object of the present invention is to provide bonding equipment which can effect positional correction of the pellet bonding without being hindered by heat.

BRIEF DESCRIPTION OF THE INVENTION

In order to accomplish such objects, the present invention consists in that a pellet is scrubbed and bonded to a substrate at a first station, and that the pellet transferred to a second station which is maintained in a heated condition, is scrubbed again and has its pellet positioning precision enhanced by means of a collet which is formed with sharper oblique planes than in a collet at the first station. Hereunder, the present invention will be described in detail in connection with an embodiment.

BRIEF DESCRIPTION OF THE DRAWINGS

FIGS. 1*a* and 1*b* are explanatory views of a part of pellet bonding equipment being provided with a mechanism for correcting the position of a pellet, in which FIG. 1*a* is a plan view thereof, while FIG. 1*b* is a partial sectional view taken along a line 1*b*—1*b* in FIG. 1*a*; and FIGS. 2*a* and 2*b* are explanatory views showing a part of bonding equipment according to the present invention, in which FIG. 2*a* is a plan view thereof, while FIG. 2*b* is a sectional view showing a state in which the bonding and correction of a pellet are performed.

DETAILED DESCRIPTION OF THE INVENTION

Figure 1A:
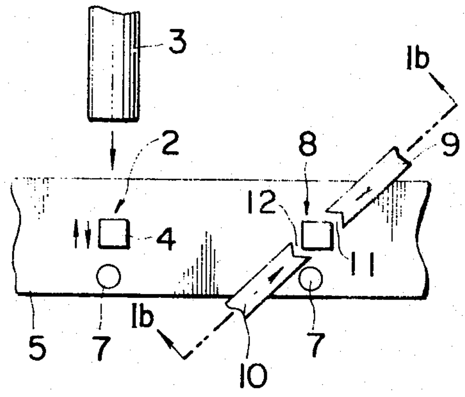
Figure 1B:
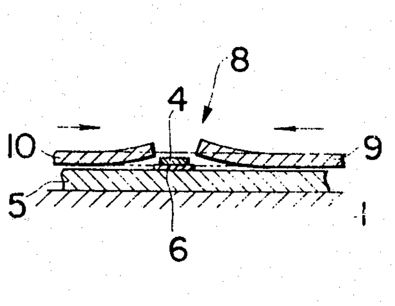
Figures 2A, 2B:
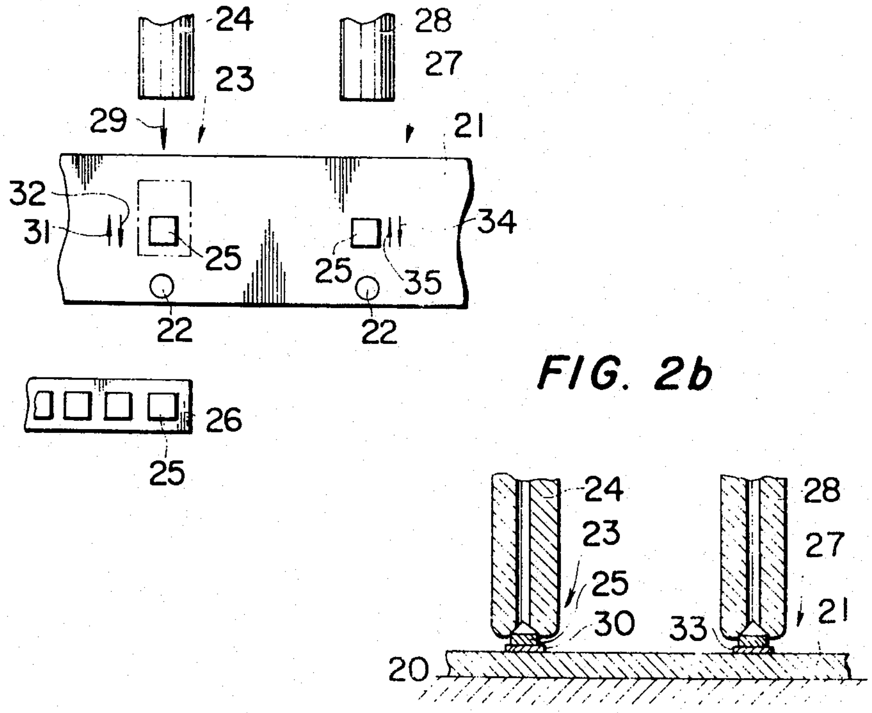

FIGS. 2*a* and 2*b* show an embodiment of bonding equipment of the present invention. As is illustrated in the figures, a substrate 21, e.g. lead frame, is placed on a heater block 20 maintained in a heated condition. The substrate 21 is provided with guide holes 22 for transfer along its side edge and at fixed intervals, and the lower end of a pin (not shown) which reciprocates to the right and left is inserted into these guide holes 22, so as to intermittently transfer the substrate 21 rightwardly as viewed in the figures.

A collet 24 is disposed at a first station 23 on the heater block 20, and is adapted to reciprocate between the heater block 20 and a jig 26 juxtaposed on the heater block and placing the pellets 25 thereon. A second station 27 is provided on the right side on the heater block 20, and a correction collet 28 for correcting the bonding position is arranged over the second station 27.

Further, both the collets 24 and 28 have a structure in which the peripheral edges of the pellet are held by oblique planes of a quadrangular poyramid, and the vertical angle of the quadrangular pyramid of the collet 24 at the first station 23 is 120, while the angle of the correcting collet 28 at the second station is as sharp as 90.

Description will now be made of the operation of the equipment. As is illustrated in FIG. 2*a*, the collet 24 facing the first station 23 advances in the direction of arrow 29 across the substrate 21 and vacuum-adsorbs the pellet 25 placed on the jig 26, whereupon it retreats again and stops just above the substrate 21. Thereafter, it descends graddually and, as is illustrated in FIG. 2*b*, it depresses the lower surface of the pellet 25 lightly onto gold foil 30 which has been previously fixed to the substrate 21. Subsequently, as is illustrated in FIG. 2*a*, the collet 24 is repeatedly swung (scrubbed) in the directions of arrows 31 and 32. Since, in this case, the substrate 21 is placed on the heater block 20, heated to approximately 400°C, a gold-silicon eutectic alloy layer (junction layer) 33 is formed at the lower surface of the pellet 25, and the pellet 25 is fixed to the substrate 21 (provisional bonding).

Subsequently, due to the movement of the pin which effects a reciprocating motion to the right and the left, the substrate 21 is shifted rightwardly by one step, and the pellet 25 after the provisional bonding is transported to the second station 27. Then, the correcting collet 28 corrects the fixed position while scrubbing the pellet 25 again in the directions of arrows 34 and 35.

Since, in this position correcting scrub operation, the correcting collet 28 is so constructed that each oblique plane of the quadrangular pyramid for holding the pellet 25 is sharp (oblique plane of 45°), the speed at which the pellet is gradually moved to the central part of the correcting collet 28 with the swing thereof is high, and the positional precision of the pellet can be confined to within $\pm 30\mu$.

As is described above, in accordance with this embodiment, the substrate 21 is transferred every 2 seconds, and provisional bonding and position-corrected bonding are successively carried out at the two consecutive stations, so that the bonding speed can be raised.

In the position-corrected bonding, the oblique planes for regulating the pellet are sharp so that the positional precision becomes high.

The collets have structure such that even when the pyramidal part of the pellet adsorbing portion spreads due to heat from the heater block, the pellet moves towards the center of the pyramidal portion and, hence, their bonding precisions do not decrease.

Since this equipment has structure in which the pellet is lightly depressed from above to thus effect the bondings, the pellet is not damaged as in the foregoing V-click system.

Furthermore, in accordance with this embodiment, the shift of the pellet bonding can be made within $\pm 30\mu$ and, hence, when employing a sequence boder in the wire bonding, once the capillary is set by the first program operation, so as to accurately move between the electrode of the pellet surface and the bonding part of the substrate, bonding can thereafter be performed continuously without any check.

The present invention is not restricted to the structure of the foregoing embodiment.

As is stated above, according to the equipment of the present invention, the precision of the pellet bonding can be raised and, therewith, the bonding can be reliably performed. Moreover, according to this equipment, high speed bonding can be achieved.

While we have shown and described one embodiment in accordance with the present invention, it is understood that the same is not limited thereto but is susceptible of numerous changes and modifications as known to a person skilled in the art, and We therefore do not wish to be limited to the details shown and described herein but intend to cover all such changes and modifications as are obvious to one of ordinary skill in the art.

What we claim:

1. Bonding equipment which bonds a pellet to the upper surface of a substrate, which is displaced intermittently, during a stationary state thereof, comprising:

first means, including a first collet to be brought in contact with the peripheral edges of said pellet, at a first station relative to which said substrate is displaceable, for scrubbing said pellet to said substrate, to effect an initial bonding of said pellet to said substrate; and second means, including a second collet, adapted to be mechanically coupled with said pellet at a second station separated from said first station in the direction that said substrate is displaceable relative to said first station, for correcting a mounting position of said pellet on said substrate, said second means including means for scrubbing said pellet to said substrate, said second collet having pyramidal planes to be brought in contact with the peripheral edges of said pellet which are formed into oblique planes sharper than pyramidal planes of said first collet at said first station.

2. Bonding equipment according to claim 1, wherein said oblique planes of each collet form a quadrangular hollow pyramid therein.

3. Bonding equipment according to claim 1, wherein the directions in which the scrubbings at said first and second stations are effected are transverse to the direction of displacement of said substrate.

4. Bonding equipment according to claim 2, wherein the vertical angle of the quadrangular pyramid of said first collet is approximately 120 degrees, while that of said second pyramid is no less than about 90 degrees.

5. Bonding equipment according to claim 1, further including a heater block on which said substrate is disposed for maintaining the temperature of said substrate at a prescribed value.

6. Bonding equipment according to claim 1, wherein each of said collets includes a vacuum line for enabling said collet to vacuum-adsorb said pellet.

7. A method for bonding a pellet to a substrate comprising the steps of:

a. scrubbing a pellet onto a substrate at a first station, relative to which said substrate is displaceable, by bringing a first collet into contact with the peripheral edges of said pellet and imparting a scrubbing motion thereto;

b. displacing said substrate from said first station to a second station which is separated from said first station; and c. correcting a mounting position of said pellet on said substrate at said second station including scrubbing said pellet onto said substrate by bringing a second collet having a hollow formed of pyramidal planes which are formed into oblique planes sharper than the pyramidal planes of a hollow of said first collet into contact with the peripheral edges of said pellet and imparting a scrubbing motion thereto.

8. A method according to claim 7, wherein step (a) further includes the steps of:

a1. disposing a metallic foil on said substrate, a2. adsorbing said pellet to said first collet; and a3. displacing said pellet into contact with said metallic foil, prior to effecting said scrubbing.

9. A method according to claim 7, wherein the direction of scrubbing carried out in steps (a) and (c) is transverse to the direction of displacement of said substrate.

10. A method according to claim 7, wherein the vertical angle of the quadrangular pyramid of said first collet is approximately 120 degrees, while that of said second pyramid is no less than about 90 degrees.

11. A method according to claim 7, further including a heater block on which said substrate is disposed for maintaining the temperature of said substrate at a prescribed value.

* * * * *